United States Patent [19]

Lo

[11] 4,350,990
[45] Sep. 21, 1982

[54] ELECTRODE FOR LEAD-SALT DIODES

[75] Inventor: Wayne Lo, Troy, Mich.

[73] Assignee: General Motors Corporation, Detroit, Mich.

[21] Appl. No.: 150,248

[22] Filed: May 16, 1980

Related U.S. Application Data

[63] Continuation-in-part of Ser. No. 15,946, Feb. 28, 1979, abandoned.

[51] Int. Cl.³ ............... H01L 29/161; H01L 29/205; H01L 29/225
[52] U.S. Cl. ......................... 357/16; 357/17; 357/30; 357/52; 357/61; 357/63; 357/67; 357/62; 357/71; 29/590; 427/92
[58] Field of Search ............ 357/16, 30, 17, 67, 357/62, 61, 63, 52, 68, 71; 427/92; 29/590

[56] References Cited

U.S. PATENT DOCUMENTS

| | | | |
|---|---|---|---|
| 2,962,394 | 11/1960 | Andres | 357/52 |
| 3,716,424 | 2/1973 | Schoolar | 357/61 |
| 3,896,473 | 7/1975 | Dilorenzo | 357/18 |
| 3,911,469 | 10/1975 | Wrobel | 357/61 |
| 4,000,508 | 12/1976 | Hager et al. | 357/61 |
| 4,017,887 | 4/1977 | Davies et al. | 357/63 |
| 4,021,836 | 5/1977 | Andrews et al. | 357/61 |
| 4,048,535 | 9/1977 | Cox et al. | 357/61 |
| 4,053,919 | 10/1977 | Andrews et al. | 357/61 |
| 4,064,621 | 12/1977 | Lo | 357/18 |
| 4,321,617 | 3/1982 | Duda et al. | 357/67 |

FOREIGN PATENT DOCUMENTS 2739309 3/1979 Fed. Rep. of Germany ........ 357/61

*Primary Examiner*—Andrew J. James
*Attorney, Agent, or Firm*—Robert J. Wallace

[57] ABSTRACT

A significantly more stable ohmic contact for a lead-salt semiconductor surface, especially for use in infrared lasers. The contact has layers of platinum, palladium or nickel alternating with gold, and then covered with indium. An Au-Pd-Au-In contact is used on lead-sulfide-selenide, lead-tin-selenide, and lead-tin-telluride of high tin content. A Pt-Au-Pt-Sn contact is preferred for lead-tin-telluride of low tin content. Lower contact resistance is attained if P type lead-tin-selenide and lead-tin-telluride surfaces are previously doped with oxygen, and the initial metal layer is applied in a manner that does not remove it.

15 Claims, 4 Drawing Figures

ELECTRODE FOR LEAD-SALT DIODES

CROSS REFERENCE TO RELATED PATENT APPLICATION

This patent application is a continuation-in-part of my copending United States patent application Ser. No. 015,946, entitled "Improved Electrode for Lead-Salt Diode Lasers", and filed Feb. 28, 1979 and now abandoned.

FIELD OF THE INVENTION

This invention relates to improved ohmic contacts on semiconductor diodes that emit radiation, and especially to improved ohmic contacts for lead-salt diode infrared lasers. It also involves an improved method of making such improved ohmic contacts.

BACKGROUND OF THE INVENTION

One type of semiconductor junction device that emits radiation is a diode laser. A semiconductor diode laser can be formed in a monocrystalline rectangular parallelepiped semiconductor body having a PN junction lying between two spaced parallel major surfaces. Two mutually parallel reflective faces that are perpendicular to the PN junction form a laser cavity adjacent one side of the PN junction. Lasing action is produced by applying a forward voltage across the PN junction. The forward bias injects electrons across the PN junction to stimulate emission of the radiation. Above a given level of electron injection, called threshold current, ($J_{TH}$), emitted radiation is collected and amplified in the laser cavity. The amplified radiation exits the laser cavity parallel the PN junction as a monochromatic coherent beam.

In order to apply the forward bias across the PN junction, ohmic contacts are made to the semiconductor material on opposite sides of the PN junction. Lead-salt semiconductors are useful in making diode lasers operating in the infrared region of the spectrum. In making diode lasers from lead-salt semiconductors, there are difficulties in obtaining suitable ohmic contacts to the P-type material. The contacts are too high in electrical resistance as formed or if low enough as formed, subsequently increase in resistance to objectionable levels. Indium is a highly desirable contact metal from a mechanical standpoint for lead-salt lasers. In fact, it has proven to be quite satisfactory in making durable low resistance ohmic contacts to N-type lead-salt surfaces. However, it did not produce durable contacts on P-type lead-salts. I have now found how to use indium to consistently obtain highly satisfactory ohmic contacts on not only P type but even N type lead-salt semiconductors. Not only does one obtain the desirable mechanical attributes of indium but one can also consistently initially obtain low contact resistance and the contact resistance remains low over extended time periods. Accordingly, they are more durable. Such durability is important to a laser diode. However, it is also important to a diode that emits light non-coherently, for example an infrared light emitting diode (LED) operating near or above room temperature. Maintaining low contact resistance on a LED is important too, particularly since one would want to operate it at room temperature or above.

OBJECTS AND SUMMARY OF THE INVENTION

It is a principal object of this invention to provide an improved ohmic contact for a lead-salt semiconductor diode.

Another object is to provide improved ohmic contacts on lead-salt semiconductor lasers.

A further object is to provide improved ohmic contacts on infrared light emitting diodes of the lead-salt type.

The invention comprehends a multilayer ohmic contact having an outer indium layer and at least two underlying layers of two different noble metals selected from the group consisting of gold, palladium, platinum and nickel. Gold or platinum must be the layer initially deposited on the semiconductor surface, in order to get low electrical resistance. The most stable contacts were obtained with three alternate layers under the indium of gold-palladium-gold. The lowest resistance contacts to P type lead-tin-telluride and lead-tin-selenide surfaces were obtained if these surfaces were previously oxygen doped and the initially deposited layer was applied in a way to preserve the oxygen doping. No such special precautions are needed for the subsequently deposited layers. Terminals can be attached to the indium layer in the usual manner, as by soldering or the like.

BRIEF DESCRIPTION OF THE DRAWING

Other objects, features and advantages of the invention will become more apparent from the following description of preferred embodiments thereof and from the drawing, in which.

DESCRIPTION OF THE PREFERRED EMBODIMENTS

Figure 1:
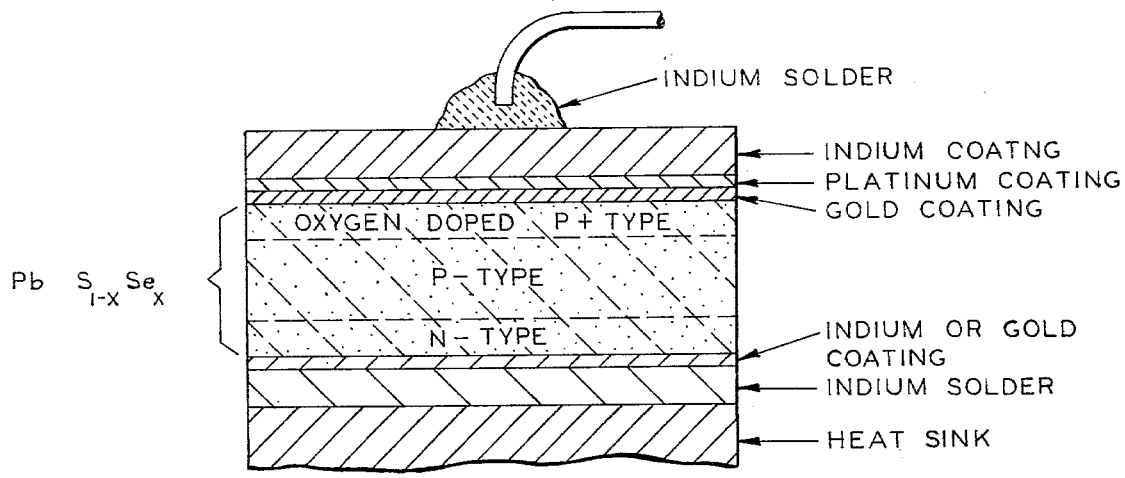
FIG. 1 shows a sectional view of a lead-sulfide-selenide diode having my gold-platinum-indium contact made with oxygen doping.

This invention is partially described in a paper entitled "Reliability Studies on Lead-Salt Diode Lasers" that I co-authored with Fay E. Gifford and published in General Motors Research Laboratories *Research Publication GMR*-2848 (October 16, 1978) and soon to be published in *Journal of Electrochemical Society* pp. 1372–1375, June 1980. This invention is also referred to in a paper I co-authored with Don E. Swets, entitled "Diffused Homojunction Lead-Sulfide-Selenide Diodes with 140 K Laser Operation", *Appl. Phys. Lett.*, v 33, n 11, pp. 938–940 (Dec. 1, 1978). These papers are incorporated herein by reference and disclose making ohmic contacts to a lead-salt laser body. Indium ohmic contacts on the P type side of lead-salt semiconductor diode lasers heretofore degraded by increase of contact resistance. An increase in contact resistance, of course, degrades performance of the laser.

I have recognized that the increase in contact resistance is found only when the laser is stored at room temperature. No such degradation occurs when the laser is cycled to and operated at temperatures below 77° K., even after several hundred hours of operation. It appears that once a laser is mounted and tested, slow degradation occurs during room temperature storage, rather than during operation or thermal cycling. Such degradation has been found on the P type side of both the lead-sulfide-selenide and lead-tin-telluride types of lead-salt semiconductors, even for gold-indium and platinum-indium laminated contacts. Tests indicate that the increase in contact resistance at least in part is caused by the diffusion of indium into the P type surface through the noble metal layer. Since indium is a donor in lead-salt materials, diffusion of indium into the P type lead-salt surface at least reduces P type conductivity at the semiconductor surface. If the indium diffusion were extensive enough, it could even form an asymmetrical, i.e. blocking, junction. In any event, at least a reduction on conductivity occurs where the semiconductor surface contacts the overlying metal. Hence, this indium diffusion appears to be a principal reason for the increase in contact resistance.

Studies have also shown that a single layer of gold or platinum, in thickness equal to a combined gold and platinum thickness, does not form as effective a barrier against indium diffusion. Moreover, in this invention, I recognize that the maximum permissible noble metal coating thickness increases when different noble metal layers comprise it. For example, if only gold or platinum is used in the noble metal coating, a maximum preferred thickness would be about 2000 angstroms. In my invention, each of the noble metal layers has a maximum preferred thickness of about 2000 angstroms. As mentioned, I prefer three noble metal layers, which provide a noble metal coating up to 6000 angstroms thick.

I believe that lowest resistance contacts should theoretically be obtainable when the platinum layer is applied first, since platinum is a higher work function metal. This is more fully explained in the paper I coauthored with F. E. Gifford that is hereinbefore referred to. However, with some semiconductors, as for example with lead-tin-selenide and lead-sulfide-selenide, suitable techniques for satisfactorily depositing the platinum are not now available. Accordingly, I prefer to use gold as the initial noble metal layer for these latter semiconductors. It has a sufficiently high work function to form a non-blocking, or electrically symmetrical, contact on their surfaces. It even has a high enough work function for use on lead-tin-telluride semiconductors having more than about 12 mole percent tin.

It should also be appreciated that lowest resistance contacts to P type lead-tin-telluride and lead-tin-telluride surfaces requires that the P type surface be more highly doped. I have found that oxygen can provide the required doping without significantly oxidizing the semiconductor surface. Oxygen doping is done before the initial noble metal layer is applied. It is accomplished by cleaning the semiconductor surface in the usual manner, and then exposing it to air for about an hour at room temperature. Then the initial noble metal layer is applied. However, I have found that the oxygen doped layer is such a thin surface skin that it can easily be destroyed, or can at least effectively disappear, when the initial metal layer is applied. Accordingly, the initial metal layer must be deposited in a manner which preserves the oxygen doped layer. If initially preserved, the dual layer noble metal coating of this invention insures that the initial effect of the oxygen doping does not subsequently degrade. At present I am not aware of any platinum deposition technique for lead-tin-selenide or lead-sulfide-selenide that provides a low resistance adherent contact. The electroplating solutions useful with lead-tin-telluride adversely attack the lead-tin-selenide and lead-sulfide-selenide surface, producing poorly adherent contacts. I believe that such etching concurrently removes the P+ surface skin which is desired in this invention. Gold has a fairly high work function and can be electroplated from a moderately acid aqueous solution that does not significantly etch the semiconductor surface. I believe this produces a more adherent contact and preserves the P+ surface skin. Hence, a low resistance contact is attained.

The noble metal layers must be selected from the group consisting of gold, palladium, platinum and nickel. Further, each layer after the initial layer must be different from the noble metal layer on which it is disposed. However, it appears that alternate layers of gold and palladium provide significantly superior results over all other combinations tested, especially when in the three-layer sequence of gold-palladium-gold. Such a sequence provides two gold-palladium interfaces to block indium diffusion. I think the gold-palladium interface blocks indium diffusion better than others. Hence, on lead-tin-telluride having an initial contact layer of platinum, I would prefer the remaining layers to be gold-palladium-gold-indium or palladium-gold-palladium-indium. Two noble metal layers under the indium were originally found to provide a contact lifetime improvement from days to weeks or months on diode layers. This was the basis of my earlier filed parent application U.S. Ser. No. 015,946. However, I subsequently found that three layers extended the room temperature lifetime from months to at least a year, and perhaps several years. Durability is now so good that contacts suitable for room temperature LED's have now been prepared. In fact my contact may be an important factor in obtaining a practical long wave length room temperature LED.

In addition, accelerated life tests indicate the gold-palladium-gold-indium contact to be so stable on P type high tin-lead-tin-telluride surfaces that I can now discern that it also helps stability on N type lead-salt surfaces too. Accordingly, I prefer to use my multilayer contact on both sides of the PN junction in a junction laser or LED. My accelerated life tests comprise maintaining the semiconductor device at a substantially constant temperature of about 60° C. in air and periodically measuring device contact resistance. Many of the comparisons made herein are based on this accelerated test.

For specific examples of this invention, reference is now made to FIG. 1. FIG. 1 shows a lead-sulfide-selenide semiconductor laser having an ohmic contact made in accordance with this invention. The laser has a body of lead-sulfide-selenide with the formula PB $S_{1-x}$ $Se_x$, wherein x varies from 0 to 1.0. In this example, x is 0.18. However, it could also be lead-tin-selenide, $Pb_{1-x}$ $Sn_x$ Se. Satisfactory tests have been made where x was 0.38 and 0.90. The laser body is a rectangular parallelepiped having an N type lower region, and a P type upper region separated by a PN junction. Other forms of lasers and LED's are known, and this invention is equally applicable to them. Only one radiant junction form is described herein, merely for convenience. As is conventional, the PN junction is substantially flat, and parallel to the upper and lower surfaces of the laser body. The upper portion of the P-type region forms the upper surface of the laser. This upper portion is believed to be doped with oxygen, to form a region of higher conductivity, a P+ type skin, or blanket, along the entire upper surface of the laser body.

A gold coating completely covers the oxygen doped P+ surface skin. A platinum coating completely covers the gold coating. An indium coating completely covers the platinum coating. The gold and platinum coatings are each approximately 500–2000 angstroms thick, preferably about 1000–1500 angstroms thick. It is difficult to form continuous films in layer thicknesses less than about 500 angstroms. Above 2000 angstroms, the layer may not adhere well. The indium coating is usually substantially thicker, as for example 1 or 2 micrometers, to enhance solderability of a terminal lead. However, the thickness of the indium coating is not especially critical. Any thickness permitting easy bonding of a terminal wire can be used. The terminal wire can be of gold, silver, the platinum group metals, or the like. It can easily be bonded to the indium coating by means of an indium solder drop.

The lower portion of the N-type region in the laser body has an indium or gold blanket coating thereon about 0.1 micrometer thick. It is bonded to a heat sink by means of a thick layer of indium solder. This ohmic contact, the technique in which it is formed, and the technique by which this surface of the laser body is bonded to the heat sink forms no part of this invention. It can be done in any of the known and accepted manners. The manner described herein is provided only for purposes of illustration.

The P type contact of FIG. 1 is not only useful on lead-sulfide-selenide laser bodies but also on lead-tin-selenide and high tin content lead-tin-telluride laser bodies. I expect it will be useful on other lead-salt semiconductors as well.

Figure 2:
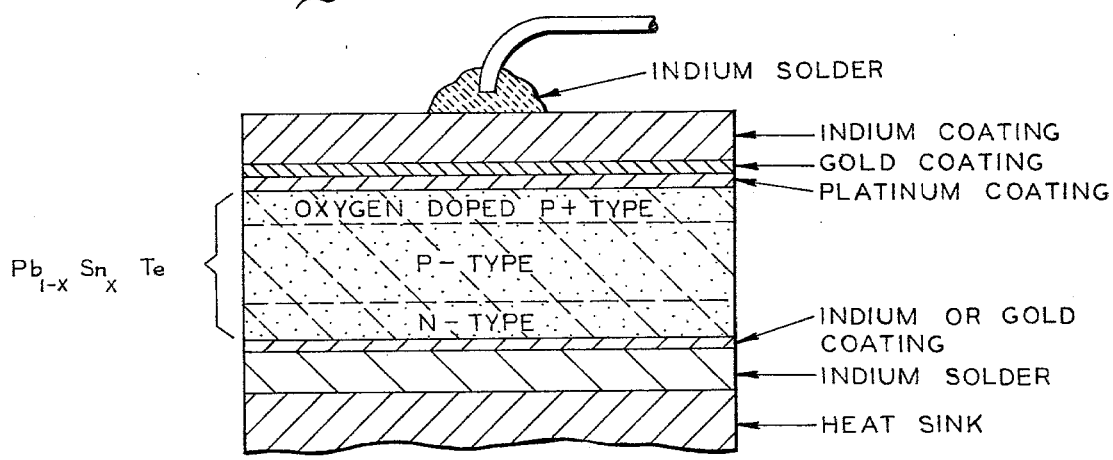
FIG. 2 shows a cross-sectional view of an oxygen doped lead-tin-telluride semiconductor having my platinum-gold-indium contact.

Referring now to FIG. 2, another laser body is shown that is similar to that shown in FIG. 1. It illustrates the other initial contact metal contemplated for this invention. As previously mentioned, adherent deposits of platinum can be satisfactorily made on lead-tin-telluride. Since it is a higher work function metal than gold, I prefer to use platinum where it is practicable. In fact, for lead-tin-telluride semiconductors in which the tin content is less than about 12 mole percent, it is essential that platinum be deposited first. Gold does not have a high enough work function to provide a sufficiently low resistance contact. Accordingly, FIG. 2 shows platinum as the initial noble metal for a lead-tin-telluride laser body. Otherwise, the laser illustrated in FIG. 2 is identical to the laser body shown in FIG. 1. It should be noted, however, that for lead-tin-telluride semiconductors having a tin content greater than about 12 mole percent, the platinum-gold sequence of FIG. 2 may be reversed.

Figure 3:
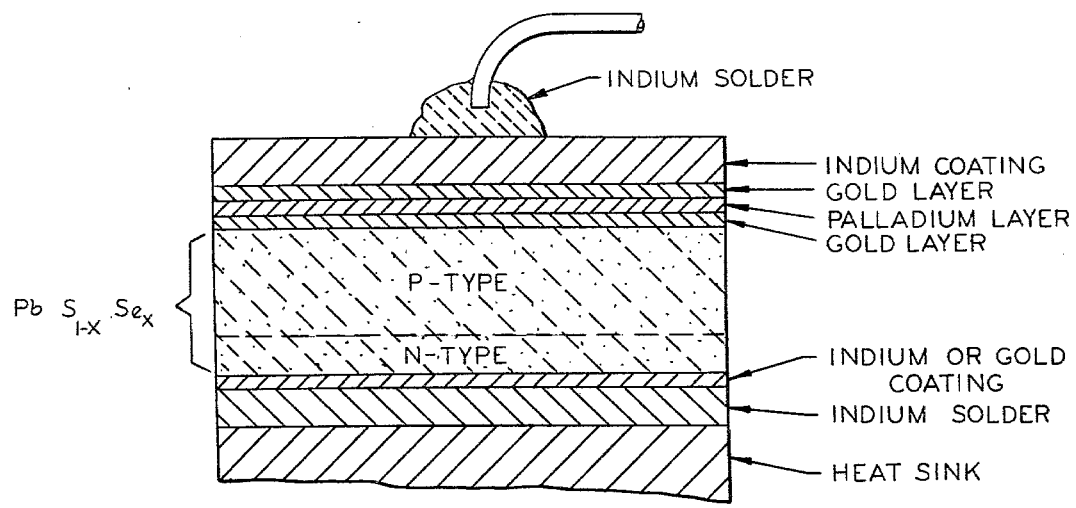
FIG. 3 shows a cross-sectional view of a lead-sulfide-selenide diode having my gold-palladium-gold-indium contact without oxygen doping.

FIG. 3 illustrates that a P+ oxygen skin is unnecessary on lead-sulfide-selenide semiconductors since the crystals produced by the most typical process have a high P type surface concentration as originally grown. Accordingly, oxygen doping is not necessary to obtain low resistance contacts. In FIG. 3, my preferred ohmic contact includes a 1500 angstrom thick gild initial layer, a 1500 angstrom thick palladium layer, a 1500 angstrom thick gold layer, and a 1-2 micrometers thick indium overlayer. In this embodiment of the invention the P type contact has two gold-palladium interfaces to block indium diffusion into the underlying P type semiconductor. The three-layer contact, or two interface barrier, appears to provide stability at room temperature for at least a year. Accelerated testing indicates that resistance may not significantly degrade for several years or more. A contact such as this would be particularly useful in a room temperature infrared LED which is diagrammatically of the same structure as illustrated in FIG. 3. The contact to the N type side of the semiconductor in FIG. 3 is the same as described in connection with FIG. 1.

Figure 4:
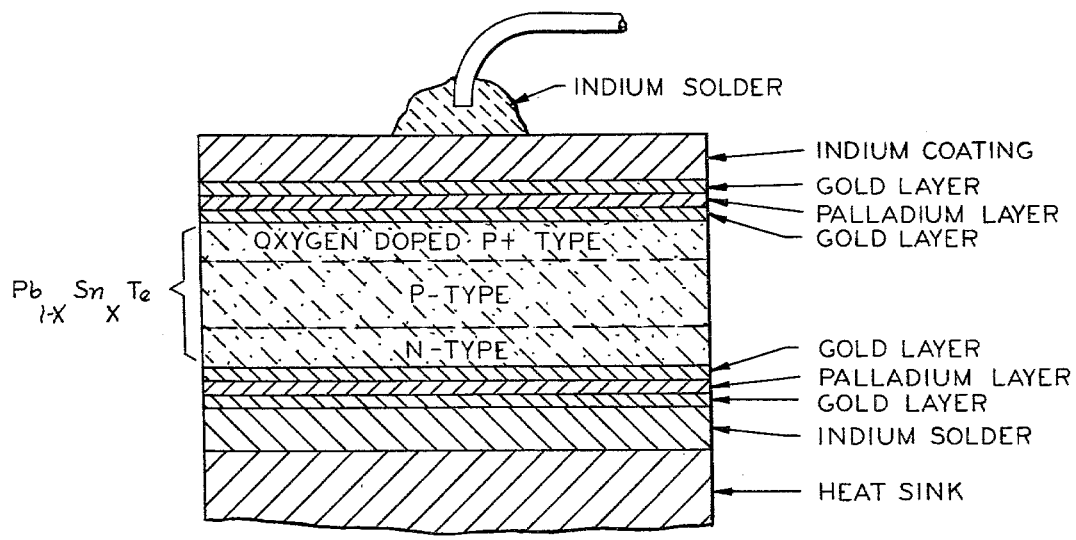
FIG. 4 shows my type of contact being used on both the P type and the N type surfaces of a lead-tin-telluride diode.

FIG. 4 illustrates still another variation of an infrared laser or light emitting diode such as illustrated in FIGS. 1–3. In this embodiment of the invention the semiconductive material is lead-tin-telluride having a tin content more than about 12 mole percent. It has an oxygen doped P+ type surface layer in contact with an initial gold layer. Noble metal layers of palladium and gold are disposed over the initial gold layer and an indium overlayer covers the noble metal layers. Hence, the coating on the P type side is the same as described in connection with FIG. 3. However, the contact to the N type side of the semiconductor in FIG. 4 is also a multilayer noble metal layer contact. As hereinbefore indicated, accelerated testing now indicates that the conventional contact on the N type side of the PN junction, such as shown in FIGS. 1–3, also degrades. However, this latter degradation is as influential as that occurring on the P type side of the junction. It was apparently masked by the P type contact degradation. Now that the P type contact is more stable, the lesser degradation of the conventional N type contact can be observed. Accordingly, I now propose to have multilayer noble metal contacts on both the N type and P type side of the PN junction in a lead-salt radiation emitting diode, whether it be of the coherent or non-coherent type. In fact, it may turn out that the multilayer contacts of this invention are essential to obtaining satisfactory room temperature operation of long wave length infrared LED's.

As previously mentioned, this invention includes an especially low resistance P type contact as formed on lead-tin-telluride and lead-tin-selenide semiconductors. The especially low resistance is attained when I expose the P type semiconductor surface to air at room temperature for at least an hour before applying the initial noble metal layer, and the applying it in a special way. The air exposure is provided after the semiconductor surface has been thoroughly cleaned in a preparation for receiving the initial metal layer. I believe the air exposure provides a significant oxygen doping on the P type semiconductor surface, that results in a P+ type surface skin. Other oxygen-containing atmospheres will probably be useful in forming this skin too, but air is preferred. It does not significantly oxidize the surface, to form an interfering oxide film that increases contact resistance. Analogously, room temperature exposure is preferred for convenience but it is expected that other temperatures can be used as well, along with a corresponding change in exposure time. With higher temperatures, exposure time can probably be decreased, and vice versa. Moderate temperatures of from somewhat below room temperature to about 100° C. would be most convenient.

Air exposure after cleaning undoubtedly has previously occurred. It may even have been for an hour or more. However, it appears that the effects of this exposure may not have been obtained. Moreover, even if obtained, they may not have been recognized or stabilized. Tests have convinced me that the oxygen doped surface skin can easily be simultaneously removed when the noble metal coating is applied. However, I have also recognized how to preserve it. The initial noble metal layer should not be applied, for example, by means of a strongly acidic or an alkaline aqueous electroplating bath. A moderately acid bath should be used, having a pH of about 4-6. One moderate acid aqueous electroplating bath that can be used to deposit platinum is E-401, which is used at pH 4 and obtained from Engelhard of Newark, N.J. Apparently, the strong acid pH 2, and the alkaline pH 8 baths remove the oxygen doping. Analogous baths can be used to electrodeposit gold, if it is this initial noble metal layer. One such gold electroplating bath is Orotemp 24 which is used at pH 6 and obtained from Technic of Providence, R.I.

The semiconductor body is immersed in the electroplating bath with plating voltage applied, i.e. current on. A low current density is used to enhance adhesion, as for example 1-10 milliamperes per square centimeter at a bath temperature of about 45° C. for the platinum deposition and about 60° C. for the gold deposition. While these proprietary electroplating baths are preferred, I expect that any moderately acid electroplating bath can be used.

It should also be mentioned that surface preparation is as important to this invention as it is in any other contact formation technique. Hence, the usual surface preparation procedures should be used to insure cleanliness and adhesion. For example, the semiconductor surface can be roughened by lapping with 5 micrometer alumina particles. It can then be lightly etched for several seconds, with 2.0% bromine in concentrated hydrobromic acid for lead-tin-telluride, and 0.5% bromine in concentrated hydrobromic acid for lead-sulfide-selenide. After this treatment it is exposed to air at room temperature for an hour, immersed in the gold electroplating bath, and the gold electrodeposited. It appears that the vacuum deposition might be an alternative to the electroplating techniques described above. However, evaporated films generally have poor adhesion on lead-sulfide-selenide in particular. Also, vacuum deposition should be performed without delay once the vacuum has been established over the semiconductor surface. Otherwise, a deleterious outdiffusion of oxygen from the P+ type surface skin might occur before metal deposition can seal it.

The initial metal layer isolates the semiconductor surface not only from oxygen outdiffusion but also from reaction of the semiconductor surface with its environment even during deposition of the second noble metal layer. It should also be noted that once the oxygen doping is sealed under two or three noble metal layers, its effects do not rapidly degrade. Apparently oxygen outdiffusion is significantly blocked, as well as indium in-diffusion. Further, one can readily obtain good adhesion between the noble metal layers. Hence, the subsequent noble metal layers can be deposited in any convenient manner. No special precautions peculiar to this invention need be observed. On the other hand, there is no objection to depositing the subsequent noble metal layers with the same precautions observed when depositing the first noble metal layer.

It should also be noted that the contact of this invention apparently inhibits diffusion of indium into the surface of the semiconductor body. It may be that the indium diffuses most rapidly through grain boundaries, and the dual layer provides an interface where the grain boundaries do not interconnect. Palladium appears to have a peculiar microstructure that provides such a grain boundary mismatch with gold that diffusion is effectively blocked. This might also explain the stability of the oxygen doping effect in this invention.

The embodiments of the invention in which an exclusive property or privilege is claimed are defined as follows:

1. In a lead-salt semiconductor diode having a P type region at one surface and a nonrectifying laminated contact on said surface of a noble metal and indium, the improvement wherein the region has an oxygen doping adjacent said surface that reduces contact resistance at said surface, said surface has successive adherent layers of platinum and gold thereon over said oxygen doped region effective to substantially block indium diffusion from an overlying layer into said oxygen doped region, which diffusion increases said contact resistance, said successive layer are in sequence effective to initially provide a low resistance electrical connection with said surface, and the indium layer overlies said successive platinum and gold layers.

2. In a lead-salt semiconductor diode laser having a P type region at one surface and a non-rectifying laminated contact on said surface of a noble metal coating and an indium coating, the improvement wherein the region has an oxygen concentration at said surface that reduces contact resistance at said surface, said noble metal coating is a lamination of platinum and gold that substantially prevents diffusion of oxygen out from said surface and diffusion of indium into it, said lamination is in sequence effective to initially provide a low resistance electrical contact on connection with said surface, and said lamination underlies said indium coating, whereby contact resistance is not only initially low but stays low over significantly longer periods of time.

3. In a diode laser of a semiconductor selected from the group consisting of lead-tin-selenide and lead-tin-telluride having a high tin content, in which the laser has a P type region at one surface and a nonrectifying laminated contact on said surface of a noble metal and indium, the improvement wherein the region has an oxygen doping at said surface that reduces contact resistance at said surface, said surface has a layer of gold thereon about 500-2000 angstroms thick, said gold layer has a layer of platinum thereon about 500-2000 angstroms thick, and a layer of indium on said platinum layer, whereby indium diffusion into said surface and oxygen diffusion out of said surface is substantially blocked and contact resistance is substantially stabilized.

4. In a lead-tin-telluride diode laser having a P type region at one surface and a nonrectifying laminated contact on said surface of a noble metal and indium, the improvement wherein the region has an oxygen doping at said surface that reduces contact resistance at said surface, said surface has about a 500-2000 angstroms thick platinum layer thereon, said platinum layer has about a 500-2000 angstroms thick gold layer thereon, and a layer of indium overlies the gold layer, whereby the oxygen doping and initial platinum layer provides an initially low contact resistance and the gold layer overlying the platinum layer effectively blocks diffusion from or to said surface to substantially stabilize the initially low contact resistance.

5. The method of making a substantially stable low resistance electrical contact to a P type surface of a semiconductive lead-salt comprising the steps of:

cleaning a P type surface region on a semiconductive lead-salt body to remove surface contaminants including any detrimental surface layers;

exposing said surface to oxygen for diffusing oxygen into said region from said surface;

applying a first layer of one metal selected from the group consisting of platinum and gold to said cleaned and oxygen doped surface for forming a low resistance electrical contact without concurrently actually or effectively significantly decreasing said oxygen doping or forming an asymmetric electrical contact with said surface;

applying a layer of the other of said metals onto said first layer; and applying a layer of indium on said layer of other metal whereby an electrical contact is made to said lead-salt surface which not only has a low electrical resistance initially but which also has long-term stability.

6. The method of making a more durable low resistance electrical contact to a P type surface of a semiconductive lead-salt diode laser comprising the steps of:

cleaning a P-type surface region on a semiconductive lead-salt laser body to remove surface contaminants including any detrimental surface layers;

forming an oxygen doped surface on said region;

applying a first adherent, electrically non-blocking layer of one metal selected from the group consisting of platinum and gold to said surface without concurrently significantly decreasing said oxygen doping;

applying a layer of the other of said metals onto said first layer; and applying a layer of indium onto said other metal layer, whereby an electrical contact is made to said lead-salt surface which is not only low in electrical resistance but which is more durable.

7. The method of making a more stable low resistance eletrical contact to a P type surface on a laser body of a semiconductive lead-salt selected from the group consisting of lead-tin-selenide and lead-tin-telluride having a high tin content, comprising the steps of:

cleaning said surface;

doping said cleaned surface with oxygen by exposing it to air at moderate temperatures;

electrodepositing about a 500-2000 angstrom thick gold layer onto said surface from a moderately acid electroplating bath to preserve said oxygen doping;

depositing about a 500-2000 angstrom thick platinum layer onto said gold layer to provide an oxygen and indium diffusion blocking layer; and depositing a layer of indium onto said platinum layer, whereby a low electrical resistance contact is made to said surface and said resistance is more stable.

8. The method of making a more stable low resistance electrical contact to a P type surface of a lead-tin-telluride semiconductive lead-salt comprising the steps of:

cleaning said surface;

doping said cleaned surface with oxygen by exposing it to air at moderate temperatures;

electrodepositing about a 500-2000 angstrom thick platinum layer onto said surface from a moderately acid electroplating bath to preserve said oxygen doping;

depositing about a 500-2000 angstrom thick gold layer onto said platinum layer to provide an oxygen and indium diffusion blocking layer; and depositing a layer of indium onto said gold layer, whereby a low electrical resistance contact is made to said surface and said resistance is more stable.

9. A more durable nonrectifying contact on a surface of a lead-salt semiconductor device having a radiation-emitting PN junction comprising at least three layers of noble metal selected from the group consisting of gold, palladium, platinum and nickel in sequence effective to provide a low resistance electrical connection to said surface and effectively block diffusion of an undesired metal into that surface from a layer overlying the aformentioned noble metal layers.

10. In a lead-salt semiconductor device having a radiation-emitting PN junction separating P type and N type regions, the improvement wherein both regions have more durable ohmic contacts and each contact comprises at least two layers of a noble metal selected from the group consisting of gold, palladium, platinum and nickel in sequence effective to initially provide a low resistance electrical connection to the respective region to subsequently substantially block undesired diffusion into the region from an overlying metal layer.

11. In a lead-salt semiconductor device having a radiation-emitting PN junction separating P type and N type regions, the improvement wherein both regions have more durable indium-type ohmic contacts and each contact comprises at least three layers of a noble metal selected from the group consisting of gold, palladium, platinum and nickel with the initial metal layer on the region being selected from gold and platinum to provide a low contact resistance as formed and the following layers provide at least one palladium-gold interface to aid in blocking diffusion of indium into the region from an overlying metal layer.

12. In a radiation-emitting diode of a semiconductor selected from the group consisting of lead-sulfide-selenide, lead-tin-selenide, and lead-tin-telluride and having a nonrectifying laminated contact on its surface of a gold coating and a covering indium coating, the improvement wherein a palladium coating covers the gold plating, a second gold coating covers the palladium coating, whereby the indium must diffuse through at least two palladium-gold interfaces to reach said surface from an overlying layer.

13. In an infrared PN junction diode laser of a semiconductor selected from the group consisting of lead-tin-selenide and lead-tin-telluride having a high tin content, and having a noble metal indium laminated ohmic contact on a P type region at one surface, the improvement wherein the region has an oxygen doping at said surface that reduces contact resistance at said surface, the noble metal coating consists essentially of alternate layers of gold, palladium and gold, with each layer being about 500-2000 angstroms thick, and the indium layer overlies the outermost gold layer, whereby indium diffusion into said surface is substantially blocked and contact resistance is substantially stabilized.

14. The method of making a substantially stable low resistance electrical contact to a surface of a semiconductive lead-salt comprising the steps of:

cleaning a surface region on a semiconductive lead-salt body to remove surface contaminants including any detrimental surface layers;

forming an oxygen doped surface on said region;

applying a first layer of one noble metal selected from the group consisting of platinum and gold to said oxygen-doped surface without significantly decreasing the oxygen doping to form a low resistance, electrically symmetrical electrical contact on said surface;

applying a second layer onto said first layer of a noble metal selected from the group consisting of gold, platinum, palladium and nickel that is other than the noble metal of the first layer;

applying a third layer onto said second layer of a noble metal selected from the group consisting of gold, platinum, palladium and nickel that is other than the noble metal of the second layer; and applying a layer of indium over the said third layer and any intervening layers, whereby an electrical contact is made to said lead-salt surface that not only initially is of low electrical resistance but which remains low even after long-term storage at room temperature.

15. The method of making a substantially stable low resistance electrical contact to a surface of lead-tin-selenide or high tin content lead-tin-telluride semiconductive lead-salt comprising the steps of:

cleaning a P type surface region on the semiconductive lead-salt body to remove surface contaminants including any detrimental surface layers;

exposing said surface to oxygen for diffusing oxygen into said region from said surface;

applying an approximately 500–2000 angstrom thick gold layer onto said cleaned and oxygen doped surface without concurrently actually or effectively significantly decreasing said oxygen doping;

applying an approximately 500–2000 angstrom thick palladium layer onto said first layer;

applying an approximately 500–2000 angstrom thick second gold layer onto said palladium layer; and applying a layer of indium onto said second gold layer, whereby an electrical contact is made to said lead-salt surface that not only has a low electrical resistance as formed but which remains low even after long-term storage at room temperature.

* * * * *

UNITED STATES PATENT AND TRADEMARK OFFICE
CERTIFICATE OF CORRECTION

PATENT NO. : 4,350,990

DATED : September 21, 1982

INVENTOR(S) : Wayne Lo

It is certified that error appears in the above—identified patent and that said Letters Patent is hereby corrected as shown below:

Column 3, lines 52-53, "tellu-ride" should read -- selenide --.

Column 10, line 41 (Claim 12), "plating," should read -- coating,--.

Signed and Sealed this

Eighth Day of February 1983

[SEAL]

Attest:

Attesting Officer

GERALD J MOSSINGHOFF

Commissioner of Patents and Trademarks